(12) United States Patent
Lee et al.

(10) Patent No.: US 10,509,760 B2
(45) Date of Patent: Dec. 17, 2019

(54) BUFFER CONTROLLER, MEMORY DEVICE, AND INTEGRATED CIRCUIT DEVICE

(71) Applicant: SAMSUNG ELECTRONICS CO., LTD., Suwon-si, Gyeonggi-do (KR)

(72) Inventors: June Hee Lee, Yongin-si (KR); Min Bo Shin, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/855,819

(22) Filed: Dec. 27, 2017

(65) Prior Publication Data

US 2019/0018816 A1 Jan. 17, 2019

(30) Foreign Application Priority Data

Jul. 12, 2017 (KR) .................. 10-2017-0088401

(51) Int. Cl.
| | |
|---|---|
| *G06F 13/36* | (2006.01) |
| *G06F 13/42* | (2006.01) |
| *G11C 7/22* | (2006.01) |
| *G06F 13/16* | (2006.01) |
| *H03M 7/16* | (2006.01) |
| *G11C 7/10* | (2006.01) |
| *G06F 5/14* | (2006.01) |
| *G06F 5/06* | (2006.01) |

(Continued)

(52) U.S. Cl.
CPC ............ *G06F 13/4243* (2013.01); *G06F 5/06* (2013.01); *G06F 5/14* (2013.01); *G06F 13/1673* (2013.01); *G11C 7/10* (2013.01); *G11C 7/222* (2013.01); *G11C 8/04* (2013.01); *G11C 8/10* (2013.01); *G11C 11/418* (2013.01); *H03M 7/16* (2013.01); *G06F 2205/126* (2013.01); *G11C 7/22* (2013.01); *G11C 2207/007* (2013.01)

(58) Field of Classification Search
None
See application file for complete search history.

(56) References Cited

U.S. PATENT DOCUMENTS

| | | | |
|---|---|---|---|
| 4,692,894 A | 9/1987 | Bemis | |
| 5,323,426 A | 6/1994 | James et al. | |

(Continued)

FOREIGN PATENT DOCUMENTS

JP 6030033 B2 10/2016

*Primary Examiner* — Henry Tsai
*Assistant Examiner* — Dean Phan
(74) *Attorney, Agent, or Firm* — Volentine, Whitt & Francos, PLLC

(57) ABSTRACT

A buffer controller includes a pointer generator, a code converter, a synchronizer, a code restorer, and a comparator. The pointer generator operates according to a first clock signal, and generates a first pointer by encoding a first address of a buffer with a first code. The code converter generates a first transmission pointer by converting the first pointer with a second code or a third code according to an amount of data stored in or read from the first address. The synchronizer synchronizes the first transmission pointer with a second clock signal. The code restorer generates a first comparison pointer by restoring the first transmission pointer, synchronized with the second clock signal, with the first code. The comparator compares the first comparison pointer with a second pointer. The second pointer defines a second address of the buffer with the first code.

20 Claims, 13 Drawing Sheets

(51) Int. Cl.
*G11C 8/04* (2006.01)
*G11C 8/10* (2006.01)
*G11C 11/418* (2006.01)

(56) References Cited

U.S. PATENT DOCUMENTS

| | | |
|---|---|---|
| 6,434,642 B1 | 8/2002 | Camilleri et al. |
| 6,553,448 B1 | 4/2003 | Mannion |
| 6,594,329 B1 | 7/2003 | Susnow |
| 6,693,918 B1 | 2/2004 | Dallabetta et al. |
| 6,810,468 B2 | 10/2004 | Miyamoto et al. |
| 6,937,172 B1 | 8/2005 | Lowe et al. |
| 7,082,504 B2 | 7/2006 | Rojas et al. |
| 7,519,746 B2 | 4/2009 | Shiraishi |
| 8,510,503 B2 | 8/2013 | Yagihashi |
| 2005/0091470 A1 | 4/2005 | Pande |
| 2009/0086874 A1 | 4/2009 | Wang et al. |
| 2010/0005250 A1* | 1/2010 | Simon ............... G06F 5/06 711/154 |
| 2010/0174877 A1* | 7/2010 | Yagihashi ............ G06F 5/14 711/155 |
| 2012/0317380 A1 | 12/2012 | Agrawal et al. |

\* cited by examiner

| BUFFER ADDRESS | FIRST CODE | SECOND CODE | THIRD CODE |
|---|---|---|---|
| 0 | 0000 | 0000 | 0000 |
| 1 | 0001 | 0001 | 0001 |
| 2 | 0010 | 0011 | 0010 |
| 3 | 0011 | 0010 | 0011 |
| 4 | 0100 | 0110 | 0110 |
| 5 | 0101 | 0111 | 0111 |
| 6 | 0110 | 0101 | 0100 |
| 7 | 0111 | 0100 | 0101 |
| 8 | 1000 | 1100 | 1100 |
| 9 | 1001 | 1101 | 1101 |
| 10 | 1010 | 1111 | 1110 |
| 11 | 1011 | 1110 | 1111 |
| 12 | 1100 | 1010 | 1010 |
| 13 | 1101 | 1011 | 1011 |
| 14 | 1110 | 1001 | 1000 |
| 15 | 1111 | 1000 | 1001 |

FIG. 9

| BUFFER ADDRESS | FIRST CODE | SECOND CODE | THIRD CODE |
|---|---|---|---|
| 0 | 0000 | 0000 | 0000 |
| 1 | 0001 | 0001 | 0001 |
| 2 | 0010 | 0010 | 0010 |
| 3 | 0011 | 0011 | 0011 |
| 4 | 0100 | 0110 | 0100 |
| 5 | 0101 | 0111 | 0101 |
| 6 | 0110 | 0100 | 0110 |
| 7 | 0111 | 0101 | 0111 |
| 8 | 1000 | 1100 | 1100 |
| 9 | 1001 | 1101 | 1101 |
| 10 | 1010 | 1110 | 1110 |
| 11 | 1011 | 1111 | 1111 |
| 12 | 1100 | 1010 | 1000 |
| 13 | 1101 | 1011 | 1001 |
| 14 | 1110 | 1000 | 1010 |
| 15 | 1111 | 1001 | 1011 |

FIG. 12

| BUFFER ADDRESS | FIRST CODE | SECOND CODE | THIRD CODE |
|---|---|---|---|
| 0 | 00000 | 00000 | 00000 |
| 1 | 00001 | 00001 | 00001 |
| 2 | 00010 | 00010 | 00010 |
| 3 | 00011 | 00011 | 00011 |
| 4 | 00100 | 00100 | 00100 |
| 5 | 00101 | 00101 | 00101 |
| 6 | 00110 | 00110 | 00110 |
| 7 | 00111 | 00111 | 00111 |
| 8 | 01000 | 01100 | 01000 |
| 9 | 01001 | 01101 | 01001 |
| 10 | 01010 | 01110 | 01010 |
| 11 | 01011 | 01111 | 01011 |
| 12 | 01100 | 01000 | 01100 |
| 13 | 01101 | 01001 | 01101 |
| 14 | 01110 | 01010 | 01110 |
| 15 | 01111 | 01011 | 01111 |
| 16 | 10000 | 11000 | 11000 |
| 17 | 10001 | 11001 | 11001 |
| 18 | 10010 | 11010 | 11010 |
| 19 | 10011 | 11011 | 11011 |
| 20 | 10100 | 11100 | 11100 |
| 21 | 10101 | 11101 | 11101 |
| 22 | 10110 | 11110 | 11110 |
| 23 | 10111 | 11111 | 11111 |
| 24 | 11000 | 10100 | 10000 |
| 25 | 11001 | 10101 | 10001 |
| 26 | 11010 | 10110 | 10010 |
| 27 | 11011 | 10111 | 10011 |
| 28 | 11100 | 10000 | 10100 |
| 29 | 11101 | 10001 | 10101 |
| 30 | 11110 | 10010 | 10110 |
| 31 | 11111 | 10011 | 10111 |

FIG. 15

BUFFER CONTROLLER, MEMORY DEVICE, AND INTEGRATED CIRCUIT DEVICE

CROSS-REFERENCE TO RELATED APPLICATION

This U.S. non-provisional patent application claims benefit of priority under 35 U.S.C. 119 to Korean Patent Application No. 10-2017-0088401, filed on Jul. 12, 2017 in the Korean Intellectual Property Office, the disclosure of which is incorporated herein by reference in its entirety.

BACKGROUND

1. Field

The present disclosure relates to a buffer controller, a memory device, and an integrated circuit device.

2. Description of Related Art

When an integrated circuit device receives data from another integrated circuit device, each of the integrated circuit device receiving the data and the integrated circuit device transmitting the data may receive or transmit the data using clock signals generated from different sources. To compensate for a frequency difference in such clock signals, a buffer may be prepared in an integrated circuit device. At least a portion of the received data may be stored in a buffer according to a clock signal of the integrated circuit device that transmits the data. The stored data in the buffer may be output from the buffer according to a clock signal of the integrated circuit device that receives the data. Thus, a write circuit storing data in the buffer and a read circuit reading data stored in the buffer may be operated according to different clock signals. Insofar as a pointer may assign an address in which data is to be stored, and a pointer may assign an address at which data to be read is stored, a device for synchronizing the pointers with each other may be helpful, beneficial or even required.

SUMMARY

An aspect of the present disclosure may provide a buffer controller, a memory device, and an integrated circuit device. The buffer controller may synchronize a pointer that indicates an address in which data is to be stored, with a pointer that indicates an address at which data to be read is stored. The addresses are in a buffer in which data is stored according to different clock signals. Data having been stored in the buffer is output from the buffer.

According to an aspect of the present disclosure, a buffer controller may include a pointer generator configured to operate according to a first clock signal. The buffer controller may generate a first pointer by encoding a first address of a buffer with a first code. The buffer controller may include a code converter configured to generate a first transmission pointer by converting the first pointer with one of a second code and a third code, different from the first code, according to an amount of data stored in the first address or read from the first address. The buffer controller may also include a synchronizer configured to synchronize the first transmission pointer with a second clock signal different from the first clock signal. The buffer controller may also include a code restorer configured to generate a first comparison pointer by restoring the first transmission pointer, synchronized with the second clock signal, with the first code. The buffer controller may moreover include a comparator configured to compare the first comparison pointer with a second pointer. The second pointer may define a second address of the buffer with the first code.

According to an aspect of the present disclosure, a memory device may include a buffer, a first pointer generator, a write circuit, a second pointer, a read circuit, and a pointer synchronizer. The first pointer generator is configured to operate according to a first clock signal, and generate a first pointer by encoding a first address of the buffer with a first code. The write circuit is configured to store first data in a storage space of the buffer corresponding to the first address. The second pointer generator is configured to operate according to a second clock signal different from the first clock signal, and generate a second pointer by encoding a second address of the buffer with the first code. The read circuit is configured to read second data stored in a storage space of the buffer corresponding to the second address. The pointer synchronizer is configured to synchronize the first pointer with the second clock signal after converting the first pointer with a transmission code different from the first code, and compare the first pointer with the second pointer by restoring the first pointer, synchronized with the second clock signal, with the first code. The transmission code may be a code in which only a single bit is changed in each period of the first clock signal.

According to an aspect of the present disclosure, an integrated circuit device may include a first circuit, a second circuit, and a memory device. The first circuit is configured to operate according to a first clock signal. The second circuit is configured to operate according to a second clock signal different from the first clock signal. The memory device is configured to store first data in a first address according to the first clock signal, and output second data to the second circuit according to the second clock signal. The first data is input by the first circuit. The memory device may compare a first pointer that indicates the first address with a second pointer that indicates the second address, by synchronizing the first pointer with the second clock signal after encoding the first pointer with a transmission code, and may compare the second pointer with the first pointer by synchronizing the second pointer with the first clock signal after encoding the second pointer with the transmission code. The transmission code may be a code in which only a single bit is changed regardless of an amount of the first data and an amount of the second data. The first data is synchronized with the first clock signal and stored in the memory device. The second data is synchronized with the second clock signal and output by the memory device.

BRIEF DESCRIPTION OF DRAWINGS

The above and other aspects, features and other advantages of the present disclosure will be more clearly understood from the following detailed description, taken in conjunction with the accompanying drawings, in which:

FIGS. 9 through 15 illustrate an operation of a buffer controller according to an example embodiment.

DETAILED DESCRIPTION

Embodiments of the present disclosure will now be described in detail with reference to the accompanying drawings.

Figure 1:
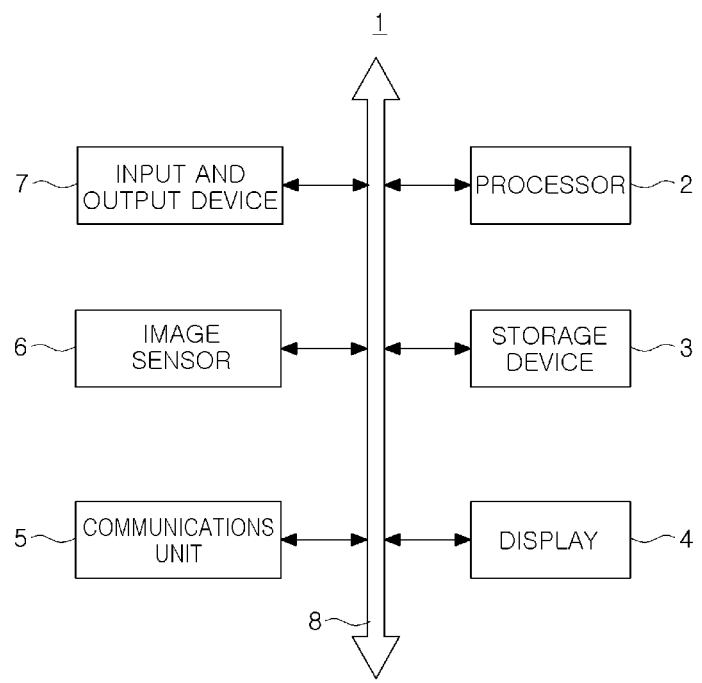
FIG. 1 is a block diagram schematically illustrating an electronic device according to an example embodiment.

FIG. 1 is a block diagram schematically illustrating an electronic device according to an example embodiment.

Referring to FIG. 1, an electronic device 1 according to an example embodiment may include a processor 2, a storage device 3, a display 4, a communications unit 5, an image sensor 6, an input and output device 7, or the like. The electronic device 1 may operate in the capacity of, be implemented as, or incorporated into various device such as a television, a desktop computer, and the like, as well as a smartphone, a tablet PC, a laptop computer, and the like. Components such as the processor 2, the storage device 3, the display 4, the communications unit 5, the image sensor 6, the input and output device 7, and the like may communicate with each other via a bus 8.

An overall operation of the electronic device 1 may be controlled by the processor 2. The processor 2 may be referred to by various names, depending on a type of the electronic device 1. In an example embodiment, when the electronic device 1 is a tablet PC or a smartphone, the processor 2 may be an application processor. When the electronic device 1 is a laptop computer or a desktop computer, the processor 2 may be a central processing unit (CPU). The storage device 3 is a device that stores data, and may include a flash memory, a dynamic random-access memory (DRAM), a static random-access memory (SRAM), a cache memory, and the like. The display 4 is a device for outputting an image, and may be implemented as a liquid crystal display (LCD), an organic light emitting diode (OLED) display, an electronic paper display, a microelectromechanical system (MEMS) display, or the like.

The communications unit 5 may be a device for mediating communications between the electronic device 1 and another external electronic device. The communications unit 5 may exchange data with an external electronic device through various communications interfaces, for example, a wired communications interface such as a universal serial bus (USB), a local area network (LAN), a micro-USB, or the like, or a wireless communications interface such as wireless fidelity (Wi-Fi), Bluetooth®, near-field communication (NFC), infrared communication, visible light communication, or the like. The image sensor 6 is a device for capturing an image, and may include a complementary metal oxide semiconductor (CMOS) image sensor, a charge coupled device (CCD) image sensor, or the like. The input and output device 7 may include devices for receiving a predetermined command from an external source or for outputting audio, vibrations, or the like. In an example embodiment, the input and output device 7 may include components such as an audio output unit, a touchscreen, a mechanical key, and the like.

The processor 2, the storage device 3, the display 4, the communications unit 5, the image sensor 6, and the input and output device 7 included in the electronic device 1 may communicate via the bus 8. One or more of the processor 2, the storage device 3, the display 4, the communications unit 5, the image sensor 6, the input and output device 7 included in the electronic device 1 may include a clock generation circuit for generating a local clock signal, therein. For example, the processor 2 may include a (first) clock generation circuit, and the communications unit 5 may include a (second) clock generation circuit. In an example embodiment, any clock generation circuit may include a phase locked loop-based oscillator circuit, or the like.

In an example embodiment, the clock generation circuit provided in the processor 2, and the clock generation circuit provided in the communications unit 5 may be controlled to generate a clock signal at the same frequency. However, except for the ideal case, even when a different clock generation circuit having the same structure is provided in each of the processor 2, the storage device 3, the display 4, the communications unit 5, the image sensor 6, and the input and output device 7, clock signals generated in the different clock generation circuits may have different frequencies.

In an example embodiment, when the communications unit 5 transmits data, received from an external electronic device, to the processor 2 via the bus 8, a data transmission speed of the communications unit 5 may be determined by a frequency of a clock signal generated in the communications unit 5. On the other hand, a speed at which the processor 2 receives data may be determined by a frequency of a clock signal generated in the processor 2. In order to compensate for such errors in data transmission and data reception, in the processor 2 and/or one or more of the storage device 3, the display 4, the communications unit 5, the image sensor 6, the input and output device 7, a memory device including a buffer therein may be prepared.

Figure 2:
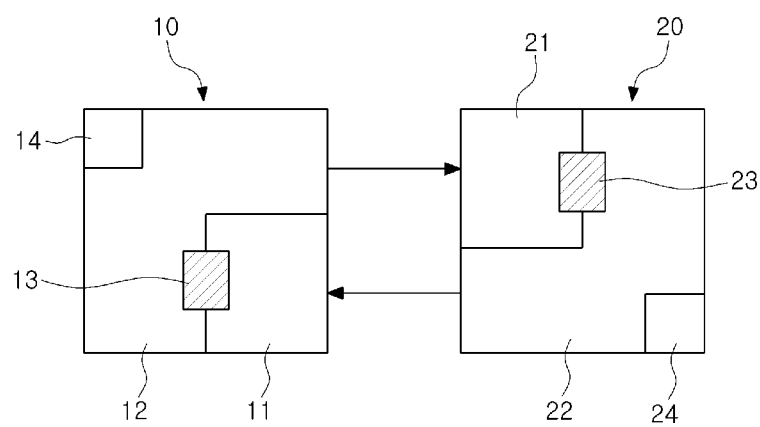
FIG. 2 illustrates an operation of an integrated circuit device according to an example embodiment.

FIG. 2 illustrates an operation of an integrated circuit device according to an example embodiment.

Referring to FIG. 2, a first integrated circuit device 10 and a second integrated circuit device 20 according to an example embodiment may exchange data via a predetermined communications interface. In an example embodiment, the first integrated circuit device 10 and the second integrated circuit device 20 may exchange data with each other through a serial communications interface.

The first integrated circuit device 10 may include first circuits 11, second circuits 12, and a first clock generation circuit 14 that generates a clock signal, respectively. The second integrated circuit device 20 may include first circuits 21, second circuits 22, and a second clock generation circuit 24 that generates a clock signal, respectively. The first integrated circuit device 10 may also include a memory device 13, and the second integrated circuit device 20 may also include a memory device 23. The first clock generating circuit 14 may generate a first clock signal, and the second clock generating circuit 24 may generate a second clock signal. Hereinafter, for convenience of explanation, an operation of an integrated circuit device according to an example embodiment will be described, taking the second integrated circuit device 20 as an example. However, an operation of an integrated circuit device according to an example embodiment may not only be applied to the second integrated circuit device 20, but also to the first integrated circuit device 10.

The first circuit 21 of the second integrated circuit device 20 may receive data from the first integrated circuit device 10. The data which the first circuit 21 receives may be transmitted in synchronization with a first clock signal generated by the first clock generating circuit 14, and the first circuit 21 may be operated according to the first clock signal. On the other hand, the second circuit 22 may be operated according to a second clock signal generated by the second clock generating circuit 24.

In an example embodiment, the first clock signal and the second clock signal may have different frequencies. Alternatively, even when the first clock signal and the second clock signal are generated to have the same frequency, frequencies of the first clock signal and the second clock signal may be different from each other by several factors. To compensate for a frequency difference between the first clock signal and the second clock signal, the memory device 23 stores and outputs data using a First-In-First-Out scheme, and may be provided between the first circuit 21 and the second circuit 22.

The memory device 23 may include a buffer for storing data, a write circuit that stores the data in the buffer in a symbol unit, a read circuit that reads the data stored in the buffer in a symbol unit, and the like. In an example embodiment, the write circuit may be operated according to a first clock signal, and the read circuit that reads the data stored in the buffer may be operated according to a second clock signal. In addition, the write circuit may add a symbol to data stored in a buffer, or may remove a symbol from data stored in a buffer, to compensate for a difference between the first clock signal and the second clock signal. By such a process, a frequency difference between the first clock signal and the second clock signal may be compensated for.

Figure 3:
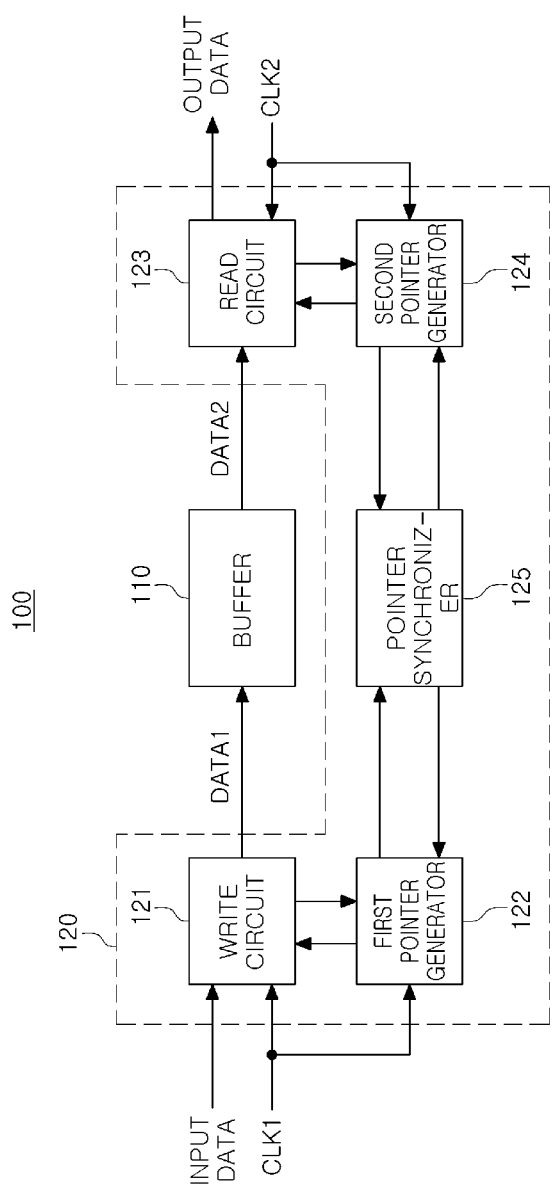
FIG. 3 is a block diagram schematically illustrating a memory device according to an example embodiment.

FIG. 3 is a block diagram schematically illustrating a memory device according to an example embodiment.

Referring to FIG. 3, a memory device 100 according to an example embodiment may include a buffer 110 that stores and outputs data, and a buffer controller 120. The buffer controller 120 may include a write circuit 121, a first pointer generator 122, a read circuit 123, a second pointer generator 124, a pointer synchronizer 125, or the like. Any pointer generator or synchronizer described herein may be a circuit that includes circuitry, and examples of circuitry for different elements of the Figures are described herein. Similarly, any pointer generator or synchronizer described herein solely by logical functions may be a processor such as the processor 2, executing instructions such as from the storage device 3.

The memory device 100 may be provided for compensating for a frequency difference between a first clock signal CLK1 and a second clock signal CLK2. In an example embodiment, the write circuit 121 and the first pointer generator 122 may be included in a first clock domain, operated according to the first clock signal CLK1. The read circuit 123 and the second pointer generator 124 may be included in a second clock domain, operated according to the second clock signal CLK2.

The write circuit 121 may receive input data and the first clock signal CLK1, and may store first data DATA1 in the buffer 110. The input data may be data transmitted in the form of a bit stream through a serial communications interface, and the write circuit 121 may include a serial-to-parallel converter for extracting symbols from the input data.

In an example embodiment, the first data DATA1 is data stored in the buffer 110 during one period of the first clock signal CLK1, and may include one symbol or multiple symbols. When the first data DATA1 includes multiple symbols, data may be simultaneously recorded in two or more storage spaces among storage spaces included in the buffer 110 due to the first data DATA1 including the multiple symbols. Each of the storage spaces included in the buffer 110 may store a single symbol. As multiple symbols are stored in the buffer 110 during one period of the first clock signal CLK1, a data processing speed of an integrated circuit device may be increased without an increase in a frequency of a clock, and power consumption of the integrated circuit device may be reduced.

In an example embodiment, when the buffer 110 has $2^N$ number of storage spaces, the first pointer generator 122 may generate a first pointer by encoding an address for identifying storage spaces of the buffer 110 with a first code having N number of bits. In an example embodiment, the first code may be a binary code. The write circuit 121 may store the first data DATA1 in a storage space of the buffer 110 corresponding to a first address indicated by the first pointer. In an example embodiment, when the first data DATA1 includes two symbols, the two symbols included in the first data DATA1 may be stored in order in a storage space of the buffer 110 corresponding to a first address and a storage space of the buffer 110 corresponding to the next address (e.g., physically or just logically adjacent, sequentially after or before) of the first address based on the first data DATA1 including two symbols.

The read circuit 123 is operated according to the second clock signal CLK2, and may read data stored in the buffer 110. In an example embodiment, the read circuit 123 may read second data DATA2 stored in a storage space corresponding to a second address of the buffer 110. The second data DATA2 may be data which the read circuit 123 reads from the buffer 110 during one period of the second clock signal CLK2. The second address may be different from the first address. The second address may be assigned by a second pointer generated by the second pointer generator 124. The second pointer generator 124 generates the second pointer by encoding the second address with the first code. The read circuit 123 may specify a storage space, in which the second data DATA2 is stored, using the second pointer.

In a manner similar to the first data DATA1, the second data DATA2 may include multiple symbols. In an example embodiment, when the second data DATA2 includes two symbols, the read circuit 123 may read symbols stored in a second address and storage spaces corresponding to the next address (e.g., physically or just logically adjacent, sequentially after or before) as the second data DATA2 based on the second data DATA2 including two symbols.

While a symbol is stored in all storage spaces of the buffer 110, when the write circuit 121 stores the first data DATA1, or when a second address indicates a storage space in which a symbol is not stored, during a process in which the buffer controller 120 stores or reads a symbol in the buffer 110, an error may occur. To prevent such an error, the pointer synchronizer 125 monitors and compares a first pointer and a second pointer, and thus determines a state of the buffer 110.

In an example embodiment, each of the first pointer generator 122 and the second pointer generator 124 receives a comparison result of a first pointer and a second pointer from the pointer synchronizer 125. Each of the first pointer generator 122 and the second pointer generator 124 determines a first address and a second address indicated by the first pointer and the second pointer, respectively, with reference to the comparison result. In addition, the pointer synchronizer 125 compares the first pointer to the second pointer, and thus monitors a state of the buffer 110 such as a remaining storage space of the buffer 110, or the like.

Referring to FIG. 3, the first pointer may be generated by the first pointer generator 122 operated according to the first clock signal CLK1. The second pointer may be generated by the second pointer generator 124 operated according to the second clock signal CLK2. Thus, to accurately compare the first pointer to the second pointer, a device for compensating for a difference between the first clock signal CLK1 and the second clock signal CLK2, asynchronously generated, may be required. Hereinafter, the device for compensating the different will be described with reference to FIG. 4 together.

Figure 4:
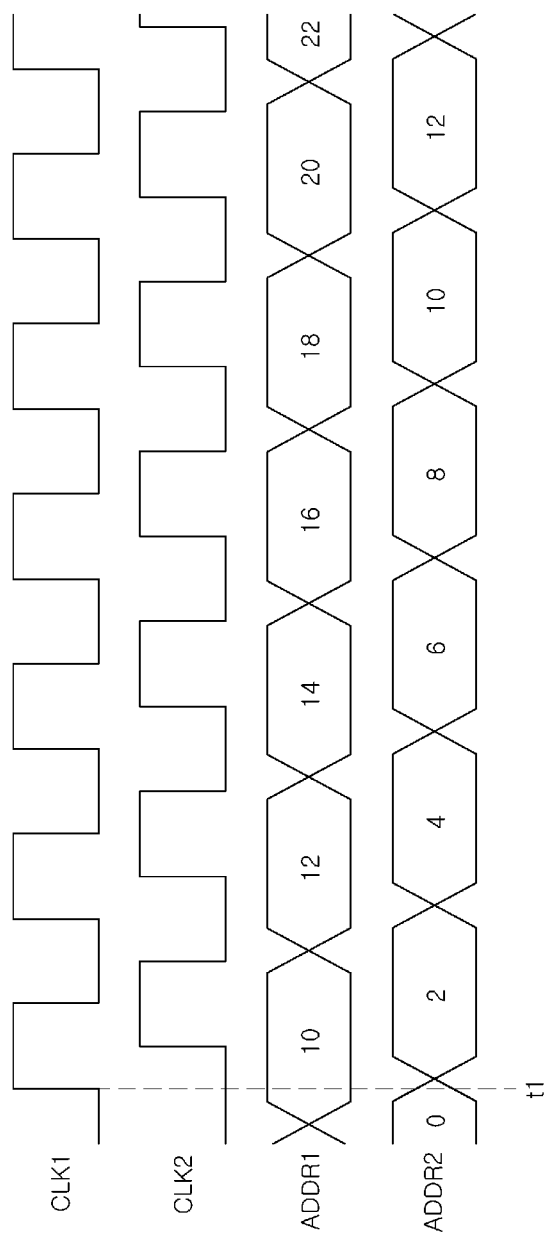
FIG. 4 is a timing diagram illustrating an operation of a buffer controller according to an example embodiment.

FIG. 4 is a timing diagram illustrating an operation of a buffer controller according to an example embodiment. Referring to FIG. 4, the first clock signal CLK1 and the second clock signal CLK2 may be different from each other. A first address ADDR1 that assigns a storage space in which the write circuit 121 is to store the first data DATA1 may be synchronized with the first clock signal CLK1 to be updated. A second address ADDR2 that assigns a storage space from which the read circuit 123 is to read the second data DATA2 may be synchronized with the second clock signal CLK2 to be updated. The first pointer may have a value obtained by encoding the first address ADDR1 with a first code, and the second pointer may have a value obtained by encoding the second address ADDR2 with a first code.

Referring to FIG. 4, due to a difference between the first clock signal CLK1 and the second clock signal CLK2, a second address may not be clearly defined at a rising edge of the first clock signal CLK1. At a time t1 of FIG. 4, a value of the first address ADDR1 may be clearly determined as 10, but a value of the second address ADDR2 may not be clearly determined as one of 0 and 2. Thus, when the first pointer and the second pointer are compared without a separate synchronization procedure, as a value of the second pointer is not clearly determined, an accurate comparison may not be performed.

To solve a problem described above, the pointer synchronizer 125 may include a synchronizer for synchronizing the first pointer to the second clock signal CLK2, or for synchronizing the second pointer to the first clock signal CLK1. Hereinafter, the pointer synchronizer 125 will be described with reference to FIGS. 5 through 7.

Figure 5:
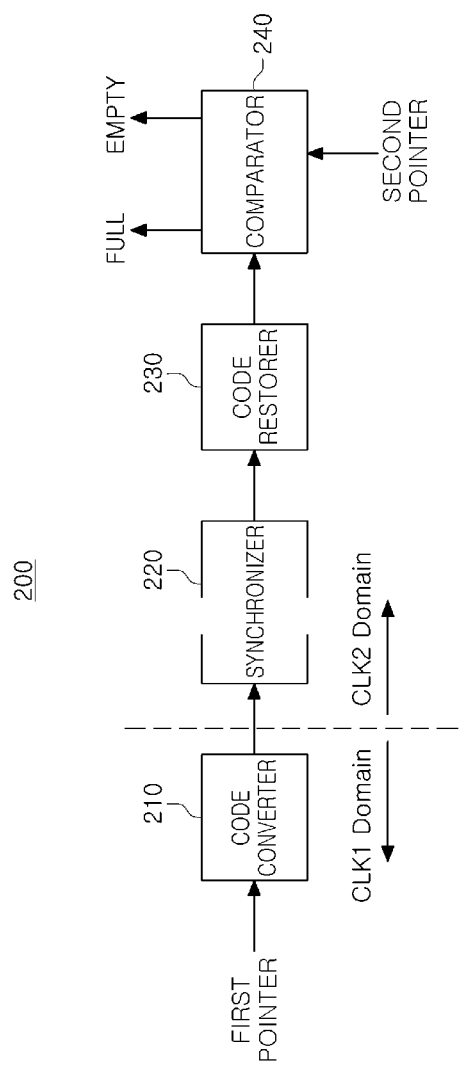
FIGS. 5 through 7 illustrating an operation of a buffer controller according to an example embodiment.
Figure 6:
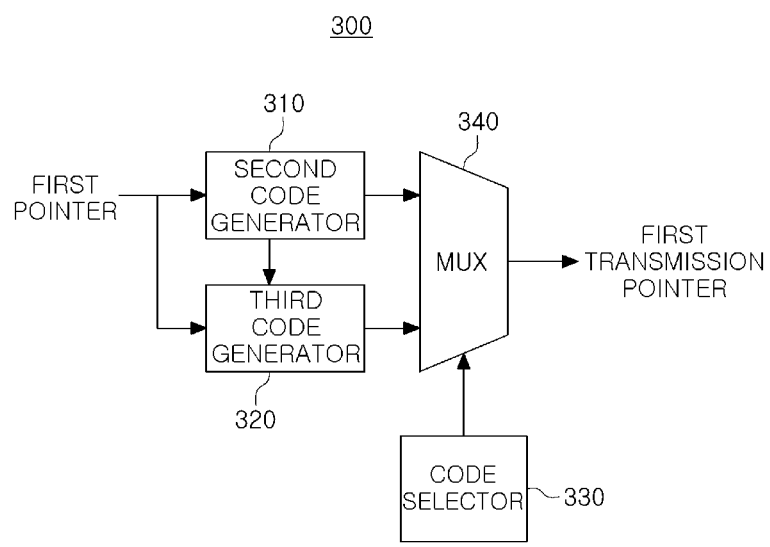
Figure 7:
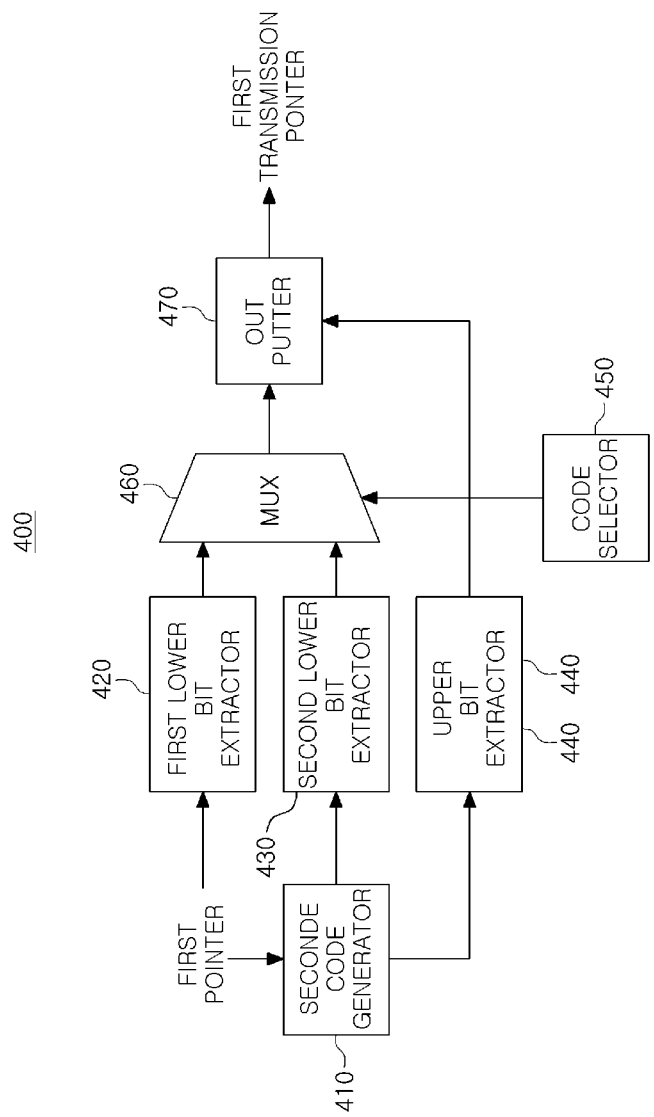

FIGS. 5 through 7 illustrate an operation of a buffer controller according to an example embodiment.

As illustrated previously, a buffer controller according to an example embodiment may include a pointer synchronizer that compares a first pointer, indicating a first address, with a second pointer indicating a second address. The first address may correspond to a storage space of a buffer in which data is to be stored, and the second address may correspond to a storage space of a buffer from which data is to be read. The first pointer may be generated in a first clock domain, operated according to a first clock signal, and the second pointer may be generated in a second clock domain, operated according to a second clock signal. The pointer synchronizer synchronizes a first pointer to a second clock signal, and then compares the first pointer to a second pointer, or synchronizes a second pointer to a first clock signal, and then compares the second pointer to a first pointer. In other words, the synchronizer switches clock signals for each pointer, i.e., for each of the first pointer and the second pointer, such as by resynchronizing from the first clock signal to the second clock signal, or vise versa.

Referring to FIG. 5, a pointer synchronizer 200 according to an example embodiment may include a code converter 210, a synchronizer 220, a code restorer 230, a comparator 240, or the like. The code converter 210 may belong to a first clock domain CLK1 Domain, operated according to the first clock signal CLK1. The synchronizer 220, the code restorer 230, and the comparator 240 may be operated according to the second clock signal CLK2 in a second clock domain CLK2 Domain. Any code converter, code restorer, or comparator described herein may be a circuit that includes circuitry or may be a circuit element, and examples of circuitry for different elements of the Figures are described herein. Similarly, any code converter, code restorer, or comparator described herein solely by logical functions may be a processor such as the processor 2, executing instructions such as from the storage device 3.

The first pointer may be generated by a first pointer generator in the first clock domain CLK1 Domain, and may have a value obtained by encoding a first address of a buffer with a first code. In an example embodiment, the first code may be a binary code, and the first address may correspond to a storage space of a buffer on/in which a write circuit is to record data. In other words, the first pointer may indicate a storage space of a buffer on/in which a write circuit is to record data. In an example embodiment, when a buffer has a total of 16 storage spaces in which data is to be stored, a first address may be one of values from 0 to 15.

The code converter 210 may generate a first transmission pointer by converting a first code with a transmission code different from the first code. The synchronizer 220 may synchronize the first transmission pointer to the second clock signal CLK2. The code restorer 230 may generate a first comparison pointer by reconverting the first transmission pointer, synchronized with the second clock signal CLK2, with the first code. In other words, the first comparison pointer may have a value the same as a first pointer, and may be synchronized with not the first clock signal CLK1 but the second clock signal CLK2.

The comparator 240 may compare the first comparison pointer to the second pointer in the second clock domain CLK2 Domain. In an example embodiment, a value of the first comparison pointer may be a value obtained by encoding the first address with a binary code, and a value of the second pointer may be a value obtained by encoding the second address with a binary code.

In an example embodiment, the synchronizer 220 may include a 2-FF synchronizer. In other words, the synchronizer 220 may include multiple flip-flops connected to each other in series, and each of the multiple flip-flops may be operated according to the second clock signal CLK2. A frequency difference, a phase difference, or the like may present between the first clock signal CLK1 and the second clock signal CLK2. Thus, when one period of the first clock signal CLK1 elapses, two or more bits are simultaneously changed in a code input to the synchronizer 220, so a metastable state may occur at an output of the synchronizer 220. To prevent the metastable state from occurring in the synchronizer 220, the synchronizer 220 may generate the first transmission pointer using a transmission code in which only a single bit is changed every time one period of the first clock signal CLK1 elapses.

A first address indicated by a first pointer may be changed in each period of the first clock signal CLK1, according to an amount of first data which a write circuit stores in a buffer during one period of the first clock signal CLK1. In an example embodiment, when the first data includes two symbols, the first address may be changed by two places due to the first data including two symbols. Moreover, when the first data includes a single symbol, the first address may be changed by one place due to the first data including the single symbol.

When the first code is a binary code, in each period of the first clock signal CLK1, two or more bits among bits included in the first code may be simultaneously changed. Thus, when a first pointer is input to the synchronizer 220 as it is without the code converter 210, a metastable state may occur at an output of the synchronizer 220, and the comparator 240 may not accurately compare a first pointer to a second pointer.

In an example embodiment, a first transmission pointer is generated by converting a first code into a transmission code, and is then input to the synchronizer 220, so a problem described above may be solved. As illustrated previously, the transmission code may be a code in which only a single bit is changed every time one period of the first clock signal CLK1 elapses. In detail, the transmission code may be a code in which only a single bit is changed every time one period of the first clock signal CLK1 elapses, regardless of the number of symbols to be stored in a buffer during one period of the first clock signal CLK1. Thus, even when the number of symbols stored in a buffer during one period of a clock according to operating conditions is changed, a first pointer and a second pointer may be accurately compared without a code error.

An operation of the pointer synchronizer 200 described above may be similarly applied to a case in which a second pointer is synchronized with the first clock signal CLK1 to be compared to a first pointer. In other words, when a second pointer is generated by encoding a second address of a buffer with a first code in the second clock domain CLK2 Domain, the second pointer is converted with a transmission code, and is then synchronized with the first clock signal CLK1. The second pointer, synchronized with the first clock signal CLK1, is restored with the first code again, and is thus compared to the first pointer in the first clock domain CLK1 Domain.

The transmission code may be selected as one of a second code defining an address of a buffer with a gray code, and a third code generated by combining a portion of bits of a first code with a portion of bits of a second code. As is known, in a gray code, two successive valued differ in only one bit. In an example embodiment, according to the number of symbols stored in a buffer during one period of the first clock signal CLK1, or the number of symbols read from a buffer during one period of the second clock signal CLK2, a transmission code may be selected as one of a second code and a third code. From a method described above, regardless of the number of symbols stored in a buffer or read from a buffer during one period of clock signals, the first clock signal CLK1 and the second clock signal CLK2, a transmission code may be generated with a code in which only a single bit is changed every time one period of the clock signals, the first clock signal CLK1 and the second clock signal CLK2, elapses.

FIGS. 6 and 7 are drawings schematically illustrating code converters 300 and 400 according to example embodiments. The code converters 300 and 400 illustrated with reference to FIGS. 6 and 7 may be similarly applied to a case in which a second transmission pointer is generated from a second pointer.

First, referring to FIG. 6, a code converter 300 according to an example embodiment may include a second code generator 310, a third code generator 320, a code selector 330, a multiplexer 340, or the like.

As illustrated previously, a first pointer may have a value obtained by encoding a first address corresponding to a storage space of a buffer in which a write circuit is to store data with a first code. The second code generator 310 may convert a first code into a second code. The second code generator 310 derives its name based on generating the second code, but otherwise may be considered the first of several code generators described herein. In an example embodiment, the first code may be a binary code, the second code may be a gray code, and the second code generator 310 may include one or more XOR gates. The third code generator 320 may generate a third code by combining a portion of bits of a first code with a portion of bits of a second code, while receiving the first code and the second code. The third code generator 320 derives its name based on generating the third code, but otherwise may be considered the second of several code generators describe herein. In an example embodiment, each of the first code, the second code, and the third code includes N number of bits, where N is a natural number greater than 2. In this case, n number of upper bits of the third code, where n is a natural number less than N, may be n number of upper bits of the second code. N–n number of lower bits of the third code may be N–n number of lower bits of the first code.

The multiplexer 340 may output one of the second code and the third code as a value of a first transmission pointer according to a command transmitted by the code selector 330, while receiving the second code and the third code. The code selector 330 may generate a command that selects one of a second code and a third code according to an amount of first data which a write circuit stores in a buffer during one period of a first clock signal.

In an example embodiment, when first data has a first amount, the code selector 330 may generate a command that selects a second code based on the first data having the first amount. When first data has a second amount, the code selector 330 may generate a command that selects a third code based on the first data having the second amount. The second amount may be greater than the first amount. In an example embodiment, the number of symbols included in the first data having the second amount may be twice the number of symbols included in the first data having the first amount.

The first amount may be determined by the number of symbols processed by a write circuit when a skip symbol is added or deleted in order to prevent an underflow and an overflow of a buffer. The second amount may be determined by the number of symbols processed by a write circuit in a normal case in which a skip symbol is not processed. To increase a data processing speed while reducing power consumption without an increase in a frequency of a clock signal, a write circuit may store multiple symbols in a buffer during one period of a first clock signal. Thus, a second amount may be greater than a first amount.

If the number of symbols stored in a buffer is constant regardless of whether a skip symbol is processed or not, a variation of a first address updated every period of a first clock signal may be constant. In an example embodiment, when a write circuit stores a single symbol in a buffer in every period of a first clock signal, a first address may be changed by one place every period of a first clock signal based on the write circuit storing a single symbol in a buffer in every period of the first clock signal. In this case, a first transmission pointer is generated by encoding a first address with a gray code, so a metastable state may be prevented from occurring in a synchronizer.

However, as a faster data processing speed and less power consumption are required in an integrated circuit device, the number of symbols processed by a write circuit and a read circuit may be increased every period of a clock signal. In this case, a variation of an address updated every period of a clock signal may be changed according to whether a skip symbol is processed or not. Thus, when an address of a buffer is simply encoded with a gray code, two or more among bits included in the gray code may be simultaneously changed. Thus, a metastable state may occur in a synchronizer.

In an example embodiment, while a case in which a skip symbol is processed and a case in which in which a skip symbol is not processed are distinguished, a first transmission pointer is generated with a second code or a third code, so a metastable state may be prevented from occurring in a synchronizer. In an example embodiment illustrated in FIG. 5, when a skip symbol is processed, a first transmission pointer may be generated with a second code. When a skip symbol is not processed, a first transmission pointer may be generated with a third code. The second code may be a code in which only a single bit is changed when a skip symbol is processed, and the third code may be a code in which only a single bit is changed when a skip symbol is not processed.

Next, referring to FIG. 7, a code converter 400 according to an example embodiment may include a second code generator 410, a first lower bit extractor 420, a second lower bit extractor 430, an upper bit extractor 440, a code selector 450, a multiplexer 460, an outputter 470, or the like.

The second code generator 410 may convert a first pointer, defining an address of a buffer with a first code, with a second code different from the first code. In an example embodiment, the first code may be a binary code, and the second code may be a gray code.

The first lower bit extractor 420 may extract a portion of lower bits of a first code, and the second lower bit extractor 430 may extract a portion of lower bits of a second code. The numbers of bits extracted by the first lower bit extractor 420 and the second lower bit extractor 430 are the same, and the number of bits may be determined according to a size of a skip symbol transmitted periodically. In an example embodiment, if a buffer has 16 storage spaces, each of a first code and a second code may include four bits. If a size of a skip symbol is 1 byte, each of the first lower bit extractor 420 and the second lower bit extractor 430 may extract a lowest bit LSB of each of a first code and a second code.

The upper bit extractor 440 may extract a portion of upper bits of a second code. In an example embodiment, when a second code includes the N number of codes and the second lower bit extractor 430 extracts n number of lower bits of the second code, the upper bit extractor 440 may extract N−n number of upper bits.

A portion of upper bits extracted by the upper bit extractor 440 may be input to the outputter 470.

The multiplexer 460 may select one of a portion of lower bits of a first code and a portion of lower bits of a second code, and then may transmit the one to the outputter 470. An operation of the multiplexer 460 may be controlled by the code selector 450. In an example embodiment, when a skip symbol is processed, the code selector 450 may control the multiplexer 460 to select a portion of lower bits of a second code. Thus, when a skip symbol is processed, a first transmission pointer output by the code converter 400 may have a value obtained by encoding an address of a buffer with a second code.

On the other hand, in a normal case in which a skip symbol is not processed, the code selector 450 may control the multiplexer 460 to select a portion of lower bits of a first code. In this case, a first transmission pointer output by the code converter 400 may have a value generated by combining a portion of bits of a first code with a portion of bits of a second code.

Figure 8:
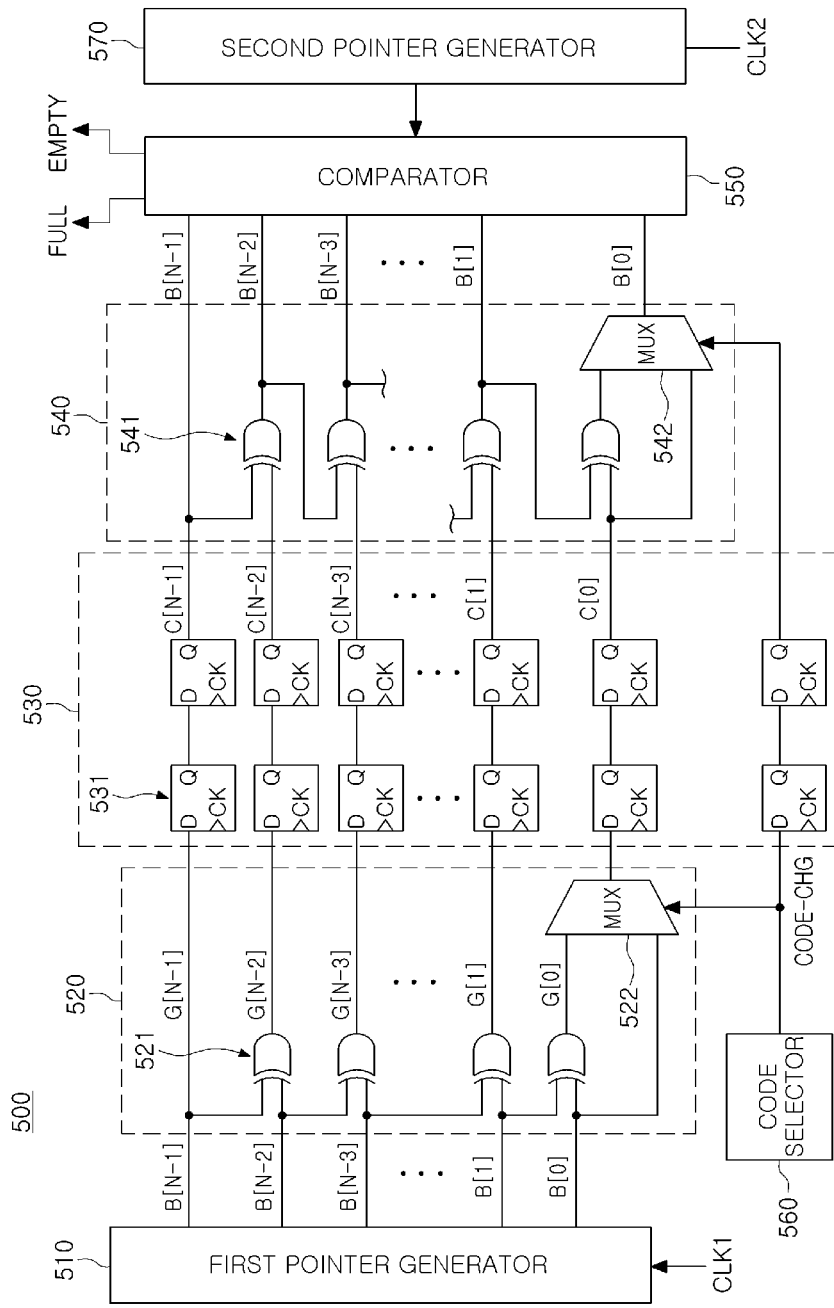
FIG. 8 is a circuit diagram schematically illustrating a buffer controller according to an example embodiment.

FIG. 8 is a circuit diagram schematically illustrating a buffer controller according to an example embodiment.

Referring to FIG. 8, a buffer controller 500 according to an example embodiment may include a first pointer generator 510, a code converter 520, a synchronizer 530, a code restorer 540, a comparator 550, or the like.

The first pointer generator 510 is operated according to the first clock signal CLK1 and generates a first pointer. The first pointer has a value obtained by encoding a first address of a buffer with a first code. The first address may be an address that indicates a storage space in which a write circuit is to record data in a buffer. In an example embodiment, the first code may be a binary code having N number of bits.

The code converter 520 may convert a first pointer with one of a second code and a third code different from a first code.

In an example embodiment, when the first code is a binary code having N number of bits, the second code may be a gray code having N number of bits. The second code may be generated by N−1 number of exclusive-OR (XOR) gates included in the code converter 520.

The code converter 520 may include a first multiplexer 522. The first multiplexer 522 may receive each of a lowest bit of a first code and a lowest bit of a second code, and may select one thereof and then output the one. The lowest bit of the first code and the lowest bit of the second code may be N−n number of lower bits. Thus, the first multiplexer 522 may select one of N−n number of lower bits, or the lowest bit (if different from N−n number of lower bits), of the first code or of the second code. An output of the first multiplexer 522 may be determined by a code selector 560. When the first multiplexer 522 selects and outputs a lowest bit of a second code, an output of the code converter 520 may be determined by the second code. On the other hand, when the first multiplexer 522 selects and outputs a lowest bit of a third code, an output of the code converter 520 may be determined by the third code. In other words, the third code may be a code generated by combining a portion of bits of the first code with a portion of bits of the second code.

The second code or the third code generated by the code converter 520 may be input to the synchronizer 530. The synchronizer 530 may include a 2-FF synchronizer corresponding to each of N number of bits. Flip-flops 531 included in the synchronizer 530 may be operated according to the second clock signal CLK2. The second clock signal CLK2 may be a clock signal used to generate a second pointer.

A second code or a third code synchronized with the second clock signal CLK2 by the synchronizer 530 may be input to the code restorer 540. The code restorer 540 may include N−1 number of XOR gates 541, and may convert a second code or a third code into a first code. In other words, an output of the code restorer 540 may be a first pointer synchronized to the second clock signal CLK2. The code restorer 540 may include a second multiplexer 542, and an output of the second multiplexer 542 may be determined by the code selector 560.

The comparator 550 may compare a first pointer synchronized to the second clock signal CLK2, to a second pointer. The second pointer is synchronized to the second clock signal CLK2 to be generated from the second pointer generator 570, so the comparator 550 may accurately compare a first pointer to a second pointer. The comparator 550 may determine whether an overflow and an underflow of a buffer occur from the first pointer and the second pointer. In addition, as the first pointer and the second pointer are compared, information for controlling operations of a write circuit and operations of a read circuit may be generated.

When a symbol is stored in all storage spaces of a buffer, a buffer controller removes a skip symbol to prevent an overflow. When all storage spaces of a buffer are empty, a buffer controller adds a skip symbol to prevent an underflow. As described above, when a skip symbol is deleted or added, the code selector 560 controls the first multiplexer 522 to output a lowest bit of a first code through a code selection command CODE_CHG based on the skip symbol being deleted or added. Thus, the code converter 520 may convert a first code into a third code. In addition, when the skip symbol is deleted or added, the code selector 560 may also control the second multiplexer 542 to output a lowest bit of a third code based on the skip symbol being deleted or added.

In summary, when a skip symbol is deleted or added, the code converter 520 may convert a first code into a third code, and a third code synchronized to the second clock signal CLK2 may be reconverted into a first code by the code restorer 540. When a skip symbol is not deleted or added, a first code is converted into a second code, and a second code synchronized to the second clock signal CLK2 may be reconverted into a first code by the code restorer 540. As in an example embodiment illustrated in FIG. 8, the buffer controller 500 is implemented, so, regardless of addition or deletion of a skip symbol, a metastable state is prevented from occurring during a synchronization process. Thus, a first pointer and a second pointer may be accurately compared.

FIGS. 9 through 15 illustrate an operation of a memory device according to an example embodiment.

In an example embodiment illustrated in FIG. 9, a buffer may have a total of 16 storage spaces. A buffer controller may add or delete a skip symbol by one at a time, and each of first data stored in a buffer in a normal operation and second data output from the buffer may include two symbols. Referring to FIG. 9, an address of a buffer is defined from 0 to 15, and a first pointer generator may generate a first pointer by encoding an address of a buffer with a first code having four bits. In an example embodiment illustrated in FIG. 9, a first code may be a binary code.

A code converter included in a buffer controller may convert a first code into a second code or a third code. The second code may be a gray code generated from the first code, a binary code. In the third code, three upper bits may be the same code as the second code, and one lower bit may be the same code as the first code. Referring to FIG. 9, in the second code, only a single bit may be changed, every time an address of a buffer moves by one place. On the other hand, in the third code, only a single bit may be changed, every time an address of a buffer moves by two places.

As illustrated previously, a first pointer that assigns an address required for a writing operation of a buffer controller is synchronized with a first clock signal to be generated, and a second pointer that assigns an address required for a reading operation is synchronized with a second clock signal to be generated. The buffer controller may compare a first pointer to a second pointer in order to accurately control a buffer, and a process of synchronizing a first pointer to a second clock signal or synchronizing a second pointer to a first clock signal may be accompanied for an accurate comparison. To prevent a metastable state from occurring in the synchronizing process, in each of the first pointer and the second pointer, only a single bit should be changed in each period of a clock signal.

A buffer controller may add or delete only a single skip symbol when a skip symbol is required to be processed, and may store or read two symbols simultaneously in an operation not related to a skip symbol. In an example embodiment, in an operation of processing a skip symbol, a first pointer is synchronized to a second clock signal by converting the first pointer with a second code. In addition, in an operation not related to a skip symbol, a first pointer is synchronized to a second clock signal by converting the first pointer with a third code. Thus, regardless of operating conditions, only a single bit is changed in a code that indicates an address of a buffer, so a metastable state is prevented from occurring in a synchronization process.

Figure 10:
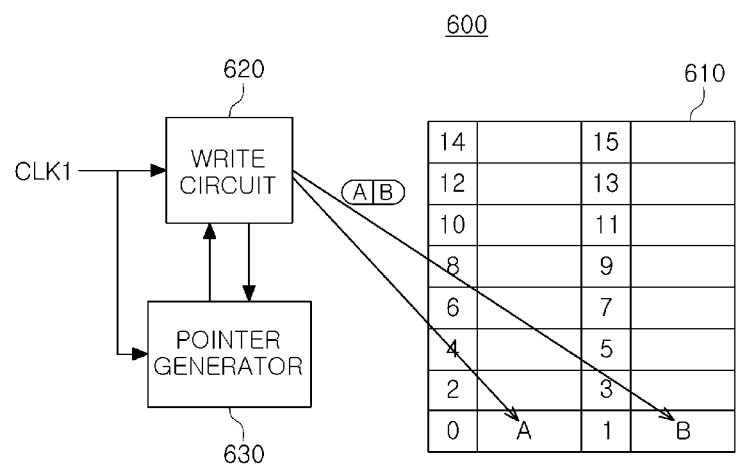
Figure 11:
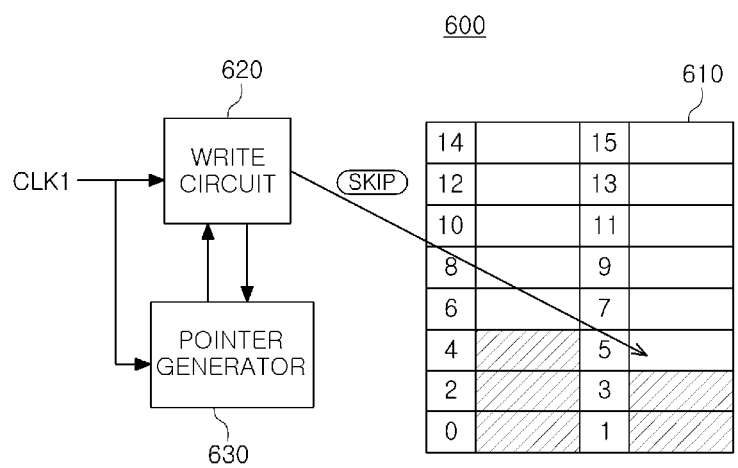

Referring to FIGS. 10 and 11, a memory device 600 according to an example embodiment may include a buffer 610, a write circuit 620, a pointer generator 630, or the like. First, referring to FIG. 10, the write circuit 620 may store two symbols A and B in a storage space of the buffer 610 indicated by addresses 0 and 1. A first pointer generated by the pointer generator 630 may have a value obtained by encoding an address 0 with a first code, [0000]. When storage of symbols A and B is completed, the pointer generator 630 may update a value of a first pointer to [0010]. The value may be a value obtained by encoding an address 2 in which the write circuit 620 is to store symbols in the next period of the first clock signal CLK1 with a first code.

As an example embodiment illustrated in FIG. 10, in an operation in which a skip symbol is not processed, a value of a first pointer is converted with a third code to be synchronized. Referring to FIG. 9 again, a third code corresponding to an address 0 indicated by a first pointer before symbols A and B are stored may be [0000], and a third code corresponding to an address 2 indicated by a first pointer after symbols A and B are stored may be [0010]. Thus, only one value among bits of a third code is changed before or after symbols A and B are stored, so a metastable state may not occur in a synchronization process using a 2-FF synchronizer.

An example embodiment illustrated in FIG. 11 may correspond to an operation of processing a skip symbol. Referring to FIG. 11, the write circuit 620 may store a skip symbol SKIP in an address 5 of the buffer 610. Referring to FIG. 9 again, a value obtained by encoding an address 5 corresponding to a storage space in which the skip symbol SKIP is to be stored with a third code may be [0111], and a third code corresponding to an address 6 indicated by a first pointer after the skip symbol SKIP is stored may be [0100]. Thus, in an example embodiment illustrated in FIG. 11, when a value of a first pointer is converted with a third code, and is then synchronized to a second clock signal, a metastable state may occur in a synchronization process.

To solve a problem described above, when the skip symbol SKIP is processed, a value of a first pointer is converted with a second code, and is then synchronized to a second clock signal. Referring to FIG. 9, a value obtained by encoding an address 5 in which the skip symbol SKIP is to be stored with a second code may be [0111], and a second code corresponding to an address 6 indicated by a first pointer after the skip symbol SKIP is stored may be [0101]. Thus, only one value among bits of a second code is changed before or after the skip symbol SKIP is stored, so a metastable state may not occur in a synchronization process using a 2-FF synchronizer.

Next, referring to FIG. 12, in an example embodiment illustrated in FIG. 12, a buffer may have a total of 16 storage spaces. A buffer controller may add or delete a skip symbol by two at a time, and each of first data stored in a buffer in a normal operation and second data output from the buffer may include four symbols. Referring to FIG. 9, an address for identifying storage spaces of a buffer is defined from 0 to 15, and a first pointer generator may generate a first pointer by encoding an address of a buffer with a first code having four bits. In an example embodiment illustrated in FIG. 12, a first code may be a binary code.

A code converter included in a buffer controller may convert a first code into a second code or a third code. The second code may be generated in the same manner as that of a third code according to an example embodiment illustrated in FIG. 9. In other words, in an example embodiment illustrated in FIG. 12, a lowest bit of a second code may be the same as a lowest bit of a first code, and three upper bits of a second code may be the same as three upper bits of a gray code generated from a first code. In an example embodiment illustrated in FIG. 12, two lower bits of a third code may be the same as two lower bits of a first code. In addition, two upper bits of a third code may be the same as two upper bits of a gray code generated from a first code.

In an example embodiment illustrated in FIG. 12, when a buffer controller processes a skip symbol, two symbols may be stored in a buffer based on the buffer controller processing the skip symbol. In an operation not related to a skip symbol, four symbols may be stored in a buffer during one period of a clock signal, or may be output from a buffer. In an example embodiment illustrated in FIG. 12, when a skip symbol is processed, a value of a first pointer is converted with a second code, and is then synchronized to a second clock signal. In addition, in an operation not related to a skip symbol, a value of a first pointer is converted with a third code, and is then synchronized to a second clock signal. Thus, regardless of whether a skip symbol is processed, only a single bit is changed in each period of a clock signal in a code that indicates an address of a buffer, so a metastable state is prevented from occurring in a synchronization process.

Figure 13:
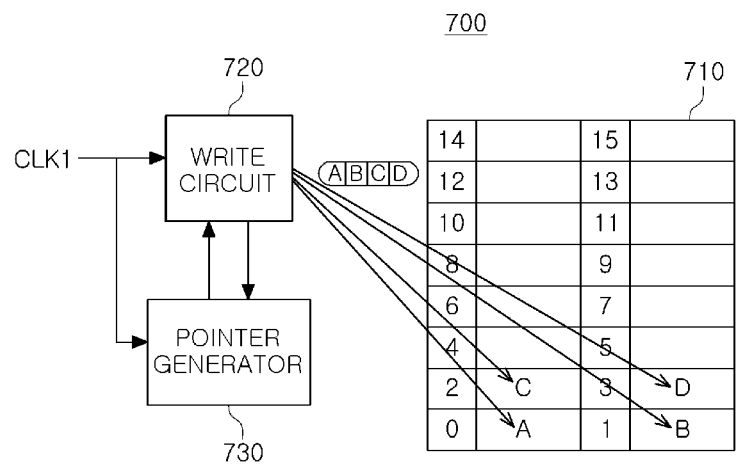
Figure 14:
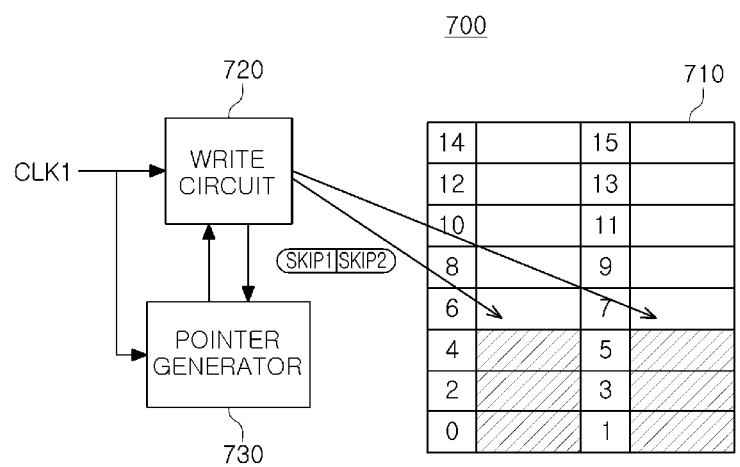

Referring to FIGS. 13 and 14, a memory device 700 according to an example embodiment may include a buffer 710, a write circuit 720, a pointer generator 730, or the like. FIG. 13 is an example embodiment illustrating an operation of the memory device 700 in a normal case when a skip symbol is not processed. FIG. 14 is an example embodiment illustrating an operation of the memory device 700 in a case when a skip symbol is processed.

First, referring to FIG. 13, the write circuit 720 may store each of four symbols A, B, C, and D in a storage space of the buffer 710 indicated by each of addresses 0, 1, 2, and 3. A first pointer generated by the pointer generator 730 may have a value obtained by encoding an address 0 corresponding to a first storage space, among storage spaces for storing four symbols A, B, C, and D, with a first code, [0000]. When storage of four symbols A, B, C, and D is completed, the pointer generator 730 may update a value of a first pointer to [0100]. The value of the first pointer, having been updated, may be a value obtained by encoding an address 4 corresponding to a first storage space, among storage spaces in which the write circuit 720 is to store symbols in a next period of the first clock signal CLK1, with a first code.

As an example embodiment illustrated in FIG. 13, when a skip symbol is not processed, a value of a first pointer is converted with a third code, and is then synchronized to a second clock signal. A third code corresponding to an address 0 indicated by a first pointer before four symbols A, B, C, and D are stored may be [0000], and a third code corresponding to an address 4 indicated by a first pointer after four symbols A, B, C, and D are stored may be [0110]. As four symbols are stored in four storage spaces during one period of the first clock signal CLK1, an address of a buffer may be changed by four places in each period of the first clock signal CLK1. Referring to FIG. 12, a third code may have characteristics in which only a single bit is changed every time an address of a buffer is changed by four places. Thus, an address of a buffer is encoded with a third code and is then synchronized to a second clock signal, so a metastable state may not occur in a synchronization process.

An example embodiment illustrated in FIG. 14 may correspond to an operation of processing a skip symbol. Referring to FIG. 14, the write circuit 720 may store skip symbols SKIP1 and SKIP2 in storage spaces indicated by addresses 6 and 7 of the buffer 710. Referring to FIG. 12, a third code that indicates an address 6 indicated by a first pointer before the skip symbols SKIP1 and SKIP2 are stored may be [0110]. A third code that indicates an address 8 indicated by a first pointer after the skip symbols SKIP1 and SKIP2 are stored may be [1100]. Thus, in an example embodiment illustrated in FIG. 14, after a value of a first pointer is converted with a third code, and is then synchronized to a second clock signal, so a metastable state may occur in a synchronization process.

In an example embodiment, to solve a problem described above, when the skip symbols SKIP1 and SKIP2 are processed, a value of a first pointer is converted with a second code, and is then synchronized to a second clock signal. Referring to FIG. 12, a second code that indicates an address 6 indicated by a first pointer before the skip symbols SKIP1 and SKIP2 are stored may be [0100]. A second code that indicates an address 8 indicated by a first pointer after the skip symbols SKIP1 and SKIP2 are stored may be [1100]. Thus, before and after the skip symbol SKIP is stored, a value of one among bits of a second code is changed, so a metastable state may not occur in a synchronization process.

In an example embodiment illustrated in FIG. 15, a buffer may include 32 storage spaces, and a buffer controller may store eight symbols simultaneously during one period of the first clock signal CLK1, and eight symbols may be simultaneously read during one period of the second clock signal CLK2. In an example embodiment illustrated in FIG. 15, when skip symbols are required to be processed, a buffer controller may simultaneously add or delete four skip symbols.

A first code may be a value of a first pointer that indicates an address of a buffer, and a value of a first pointer may be updated according to a first clock signal. A second code and a third code are codes generated from a first code, and may be used in a process in which a first pointer is synchronized to a second clock signal different from a first clock signal. In an example embodiment, a buffer controller converts a value of a first pointer with a second code or a third code, and is then synchronized with the second clock signal.

When a buffer controller adds or deletes skip symbols, a buffer controller converts a value (a first code) of a first pointer that indicates an address of a buffer with a second code to be synchronized with the second clock signal. As illustrated previously, in an example embodiment illustrated in FIG. 15, skip symbols may be added or deleted four at a time. A second code may have characteristics in which only a single bit is changed when an address of a buffer is changed four at a time. Thus, when skip symbols are required to be added or deleted, a value of a first pointer is converted with a second code and synchronized to the second clock signal, so a metastable state is prevented from occurring in a synchronization process.

When a buffer controller does not process skip symbols, the buffer controller may convert a value (a first code) of a first pointer that indicates an address of a buffer with a third code to be synchronized with the second clock signal. As illustrated previously, in an example embodiment illustrated in FIG. 15, symbols including common data may be stored in a buffer by eight at a time, or may be output from a buffer. A third code may have characteristics in which only a single bit is changed when an address of a buffer is changed eight at a time. Thus, under normal operating conditions in which a skip symbol is not processed, a value of a first pointer is converted with a third code and synchronized with the second clock signal, so a metastable state may be prevented from occurring in a synchronization process.

Figure 16:
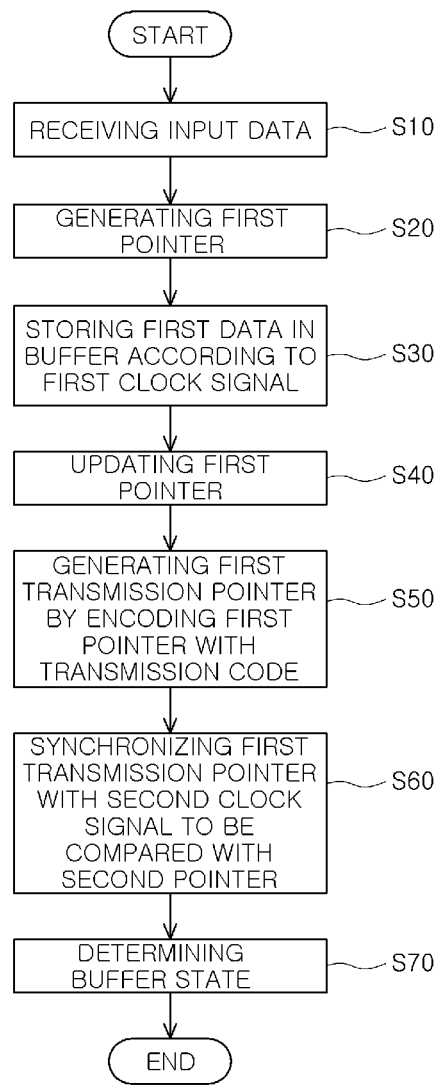
FIG. 16 is a flow chart illustrating an operation of a buffer controller according to an example embodiment.

FIG. 16 is a flow chart illustrating an operation of a buffer controller according to an example embodiment.

Referring to FIG. 16, an operation of a buffer controller according to an example embodiment begins, as a buffer controller may receive input data (S10). The input data received in S10 may be data to be transmitted through a serial communications interface in the form of a bit stream. A buffer controller may extract multiple symbols from input data using a serial-to-parallel converter, while restoring a first clock signal used for transmitting input data.

A buffer controller may generate a first pointer synchronized with a first clock signal to be generated (S20). The first pointer may be a parameter that indicates an address of a storage space of a buffer in which a buffer controller is to store symbols. In an example embodiment, a first pointer may have a value obtained by encoding an address of a storage space of a buffer with a first code.

Next, a buffer controller may store symbols extracted from input data in a buffer as first data (S30). The first data may be synchronized to a first clock signal and stored in a buffer. In an example embodiment, first data may be stored in a storage space corresponding to an address indicated by a first pointer. The first data stored in a buffer during one period of a first clock signal may include multiple symbols.

When symbols are stored in a buffer, a buffer controller may update a first pointer (S40). When symbols are stored during a first period of a first clock signal, in order to indicate an address of a storage space in which symbols are to be stored during a second period following the first period, a first pointer may be updated. Thus, in a manner similar to the process of storing first data, a process of updating a first pointer may be performed through synchronization with a first clock signal.

A buffer controller may generate a first transmission pointer by encoding a first pointer with a transmission code (S50). The first transmission pointer is synchronized to a second clock signal different from a first clock signal to be compared to a second pointer (S60). A buffer controller may determine a state of a buffer based on a comparison result of a first pointer and a second pointer (S70).

In an example embodiment, each of a first clock signal and a second clock signal may be a clock signal required for storing data in a buffer or reading data from a buffer. A first pointer and a second pointer may have a value that indicates an address assigned to a storage space of a buffer in which data is to be stored or from which data is to be read. A buffer controller may determine a state of a buffer using a first pointer and a second pointer.

For a buffer controller to accurately determine a state of a buffer, an accurate comparison of a first pointer and a second pointer may be required. However, a first pointer is synchronized with a first clock signal to be generated, and a second pointer is synchronized with a second clock signal to be generated. Thus, when the first clock signal and the second clock signal are different, the first pointer and the second pointer may not be accurately compared. To solve a problem described above, a method may be used to compare a first pointer to a second pointer after the first pointer is synchronized to a second clock signal, or a method may be used to compare a second pointer to a first pointer after the second pointer is synchronized to a first clock signal.

A value of each of the first pointer and the second pointer may have a digital code having N-number of bits, where N is a natural number. When a first pointer is synchronized with a second clock signal or a second pointer is synchronized with a first clock signal, a synchronizer may be used in which multiple flip-flops are connected in series. When two or more bits, among N number of bits included in a first pointer or a second pointer, are simultaneously changed in each period of a clock, a metastable state may occur in a synchronizer, so accurate synchronization may not be performed.

In an example embodiment illustrated in FIG. 16, a problem described above may be solved in S50 and S60. A transmission code may be a code in which only a single bit among N number of bits included in a first pointer is changed in each period of a clock. In other words, the transmission code may be a code in which only a portion of bits included in the first pointer is/are changed in each period of a clock. Thus, a first transmission pointer generated by encoding a value of a first pointer with a transmission code is synchronized to a second clock signal, so a metastable state is prevented from occurring in a synchronizer. Similarly, a second pointer is also encoded with a transmission code, and is then synchronized to a first clock signal.

As set forth above, according to example embodiments of the present disclosure, each of a pointer indicating an address in which data is to be stored, and a pointer indicating an address in which data to be output is stored, are converted with a predetermined transmission code, and may be compared to each other after being synchronized to one clock signal. The transmission code may be a code in which only a single bit is changed regardless of an amount of data to be stored in a buffer or to be output from a buffer during one period of a clock signal. Thus, a metastable state may be prevented from occurring in a process in which pointers are synchronized, and whether an overflow and an underflow of a buffer has occurred, and the like, may be accurately determined.

While example embodiments have been shown and described above, it will be apparent to those skilled in the art that modifications and variations could be made without departing from the scope of the present disclosure, as defined by the appended claims.

What is claimed is:

1. A buffer controller, comprising:
   a pointer generator configured to operate according to a first clock signal, and generate a first pointer by encoding a first address of a buffer with a first code;
   a code converter configured to generate a first transmission pointer by converting the first pointer with one of a second code and a third code, different from the first code, selected according to an amount of data stored in the first address or read from the first address;
   a synchronizer configured to synchronize the first transmission pointer with a second clock signal different from the first clock signal;
   a code restorer configured to generate a first comparison pointer by restoring the first transmission pointer, synchronized with the second clock signal, with the first code; and
   a comparator configured to compare the first comparison pointer with a second pointer, the second pointer defining a second address of the buffer with the first code.

2. The buffer controller of claim 1, wherein the synchronizer and the code restorer operate according to the second clock signal.

3. The buffer controller of claim 1, wherein the comparator compares the first comparison pointer with the second pointer to detect at least one of an overflow and an underflow of the buffer.

4. The buffer controller of claim 1, wherein the first code is a binary code, the second code is a gray code generated from the first code, the third code is a code generated by combining a portion of the first code with a portion of the second code, and
each of the first code, the second code, and the third code includes N number of bits, where N is a natural number greater than 2.

5. The buffer controller of claim 4, wherein, when an amount of data stored in the first address or read from the first address during one period of the first clock signal is a first amount, the code converter converts the first pointer with the second code based on the amount of data being the first amount.

6. The buffer controller of claim 5, wherein, when the amount of data stored in the first address or read from the first address during one period of the first clock signal is a second amount, larger than the first amount, the code converter converts the first pointer with the third code based on the amount of data being the second amount.

7. The buffer controller of claim 4, wherein
n is a natural number less than N,
n number of upper bits of the third code have the same value with n number of upper bits of the second code, and
N−n number of lower bits of the third code have the same value with the N−n number of lower bits of the first code.

8. The buffer controller of claim 7, wherein the code converter includes:
a first code generator configured to convert the first code into the second code;
a second code generator configured to generate the third code by combining a portion of the first code with a portion of the second code; and
a code selector configured to control the code converter to output one of the second code and the third code, based on the amount of data stored in the first address or read from the first address during one period of the first clock signal.

9. The buffer controller of claim 8, wherein the first code generator includes N−1 number of exclusive-OR (XOR) gates.

10. The buffer controller of claim 7, wherein n is determined according to a size of a skip symbol added to the data or deleted from the data.

11. The buffer controller of claim 7, wherein the code converter includes a multiplexer that selects one of N−n number of lower bits of the first code and N−n number of lower bits of the second code.

12. The buffer controller of claim 1, wherein the synchronizer includes a plurality of flip-flops connected to each other in series, and the plurality of flip-flops operate according to the second clock signal.

13. A memory device, comprising:
a buffer;
a first pointer generator configured to operate according to a first clock signal, and generate a first pointer by encoding a first address of the buffer with a first code;
a write circuit configured to store first data in a storage space of the buffer corresponding to the first address;
a second pointer generator configured to operate according to a second clock signal different from the first clock signal, and generate a second pointer by encoding a second address of the buffer with the first code;
a read circuit configured to read second data stored in a storage space of the buffer corresponding to the second address; and
a pointer synchronizer configured to synchronize the first pointer with the second clock signal after converting the first pointer with a transmission code different from the first code, and compare the first pointer with the second pointer by restoring the first pointer, synchronized with the second clock signal, with the first code,
wherein the transmission code is a code in which only a single bit is changed in each period of the first clock signal.

14. The memory device of claim 13, wherein the pointer synchronizer synchronizes the second pointer with the first clock signal after converting the second pointer with the transmission code, and compares the second pointer with the first pointer by restoring the second pointer, synchronized with the first clock signal, with the first code.

15. The memory device of claim 13, wherein the transmission code is one of a second code and a third code, different from the first code, selected according to an amount of data stored in the first address or read from the first address, and the third code is generated by combining a portion of bits of the first code with a portion of bits of the second code.

16. The memory device of claim 15, wherein the first code is a binary code, and the second code is a gray code.

17. The memory device of claim 16, wherein the pointer synchronizer generates the third code by combining a portion of upper bits of the second code with a portion of lower bits of the first code.

18. An integrated circuit device, comprising:
a first circuit configured to operate according to a first clock signal;
a second circuit configured to operate according to a second clock signal different from the first clock signal; and
a memory device configured to store first data in a first address according to the first clock signal, and to output second data stored in a second address to the second circuit according to the second clock signal,
wherein the first data is input by the first circuit,
the memory device compares a first pointer that indicates the first address with a second pointer that indicates the second address, by synchronizing the first pointer with the second clock signal after encoding the first pointer with a transmission code, and compares the second pointer with the first pointer by synchronizing the second pointer with the first clock signal after encoding the second pointer with the transmission code, and
the transmission code is a code in which only a single bit is changed regardless of an amount of the first data and an amount of the second data, the first data is synchronized with the first clock signal and stored in the memory device, and the second data is synchronized with the second clock signal and output by the memory device.

19. The integrated circuit device of claim 18, wherein the transmission code is one of a gray code, or a code in which a gray code and a binary code are combined with each other.

20. The integrated circuit device of claim 18, wherein the first circuit receives input data including the first data through a serial communications interface.

\* \* \* \* \*